United States Patent
Tombs

(10) Patent No.: US 10,524,356 B2
(45) Date of Patent: Dec. 31, 2019

(54) TRANSPARENT ANTENNA

(71) Applicant: Eastman Kodak Company, Rochester, NY (US)

(72) Inventor: Thomas Nathaniel Tombs, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 118 days.

(21) Appl. No.: 15/725,321

(22) Filed: Oct. 5, 2017

(65) Prior Publication Data

US 2019/0110360 A1    Apr. 11, 2019

(51) Int. Cl.
| | | |
|---|---|---|
| *H01Q 1/12* | (2006.01) | |
| *H01Q 9/04* | (2006.01) | |
| *H05K 1/02* | (2006.01) | |
| *H05K 1/09* | (2006.01) | |
| *H01Q 1/38* | (2006.01) | |

(52) U.S. Cl.
CPC .......... *H05K 1/0274* (2013.01); *H01Q 1/1271* (2013.01); *H01Q 1/38* (2013.01); *H01Q 9/0407* (2013.01); *H05K 1/09* (2013.01)

(58) Field of Classification Search
CPC .. H01Q 1/1271; H01Q 1/1278; H01Q 1/2258; H01Q 1/2266; H01Q 1/24; H01Q 1/241; H01Q 1/242; H01Q 1/243; H01Q 1/27; H01Q 1/273; H01Q 1/276; H01Q 1/32; H01Q 1/325; H01Q 1/3266; H01Q 1/3291; H01Q 1/38; H01Q 9/0407; H01Q 9/065; H01Q 9/285; H05K 1/0274; H05K 1/09
See application file for complete search history.

(56) References Cited

U.S. PATENT DOCUMENTS

| | | |
|---|---|---|
| 5,083,135 A | 1/1992 | Nagy et al. |
| 5,528,314 A | 6/1996 | Nagy et al. |
| 5,712,645 A | 1/1998 | Jellum et al. |
| 5,872,542 A | 2/1999 | Simons et al. |
| 6,317,090 B1 * | 11/2001 | Nagy .................. H01Q 1/1271 343/713 |
| 6,433,756 B1 | 8/2002 | Sievenpiper et al. |
| 6,739,028 B2 | 5/2004 | Sievenpiper et al. |
| 6,911,952 B2 | 6/2005 | Sievenpiper |
| 6,952,190 B2 | 10/2005 | Lynch et al. |
| 7,102,586 B2 | 9/2006 | Liang et al. |
| 7,218,281 B2 | 5/2007 | Sievenpiper et al. |
| 7,233,296 B2 | 6/2007 | Song et al. |
| 7,289,073 B2 | 10/2007 | Song et al. |
| 7,656,357 B2 * | 2/2010 | Ishibashi .............. H01Q 1/1271 343/713 |

(Continued)

*Primary Examiner* — Daniel Munoz
*Assistant Examiner* — Patrick R Holecek
(74) *Attorney, Agent, or Firm* — Kevin E. Spaulding

(57) ABSTRACT

A transparent antenna includes a conductive material disposed on a surface of a non-opaque substrate in one or more conductive regions, wherein a geometry of the conductive regions defines an antenna pattern. A non-conductive material is disposed on the surface of the substrate in a fill pattern which is an inverse of the antenna pattern. An average optical transparency in the conductive regions and the non-conductive regions is at least 50%, and the average optical transparency in the conductive regions differs from that of the non-conductive regions by no more than 10%.

21 Claims, 8 Drawing Sheets

(56) References Cited

U.S. PATENT DOCUMENTS

| | | |
|---|---|---|
| 7,830,310 B1 | 11/2010 | Sievenpiper et al. |
| 7,911,407 B1 | 3/2011 | Fong et al. |
| 7,929,147 B1 | 4/2011 | Fong et al. |
| 8,711,053 B2 * | 4/2014 | Takano ............... H01Q 1/1271 343/906 |
| 8,941,095 B2 | 1/2015 | Song et al. |
| 9,231,213 B2 | 1/2016 | Song et al. |
| 9,504,164 B2 | 11/2016 | Ramakrishnan et al. |
| 9,653,792 B2 | 5/2017 | Dai |
| 2005/0231426 A1 | 10/2005 | Cohen |
| 2009/0140938 A1 | 6/2009 | Ishibashi et al. |
| 2013/0264390 A1 | 10/2013 | Frey et al. |
| 2014/0248423 A1 | 9/2014 | Ramakrishnan et al. |
| 2016/0168713 A1 | 6/2016 | Reuter et al. |
| 2016/0190678 A1 | 6/2016 | Hong et al. |

\* cited by examiner

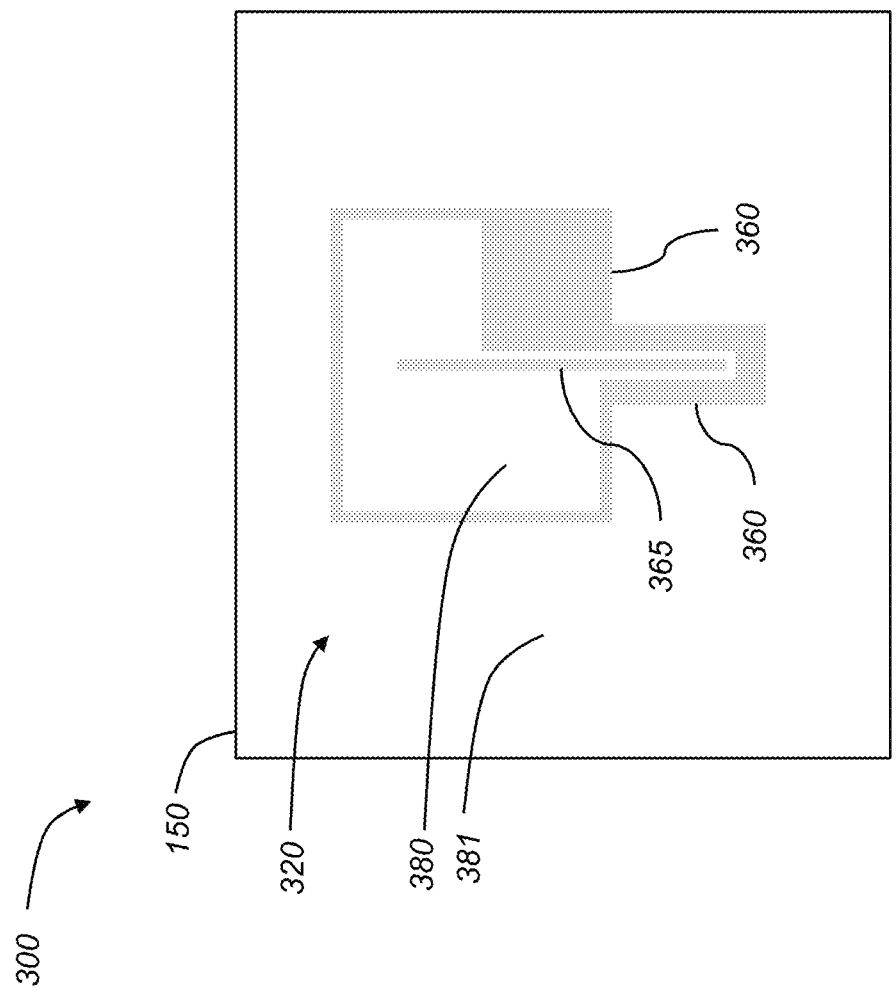

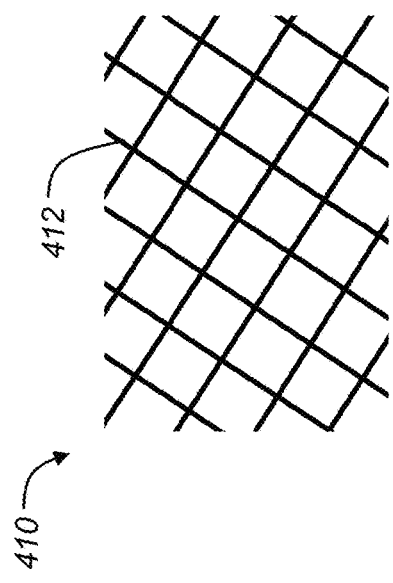
FIG. 4A
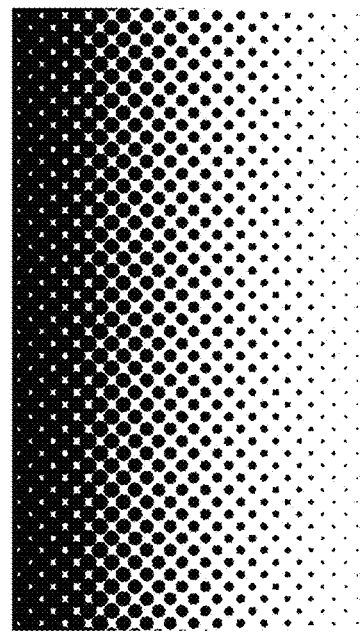
FIG. 4C
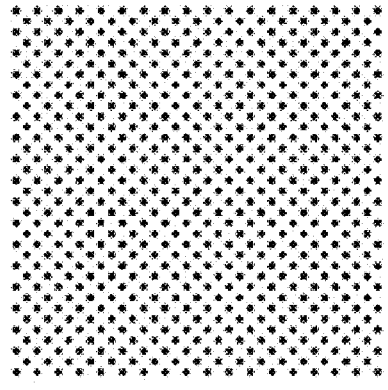
FIG. 4B
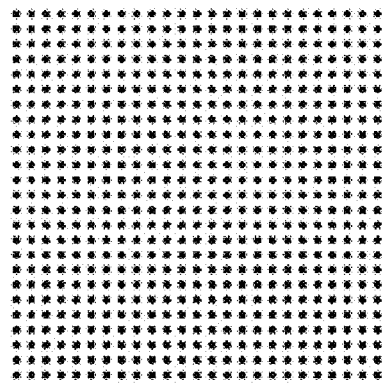

TRANSPARENT ANTENNA

CROSS-REFERENCE TO RELATED APPLICATIONS

Reference is made to commonly assigned, co-pending U.S. patent application Ser. No. 15/725,328, entitled "Method for fabricating a transparent antenna," by T. Tombs, which is incorporated herein by reference.

FIELD OF THE INVENTION

This invention pertains to the field of antennas, and more particularly to antennas on a transparent surface that are visually undetectable to a human observer.

BACKGROUND OF THE INVENTION

Mast or whip antennas mounted on the exterior of a vehicle such as an automobile have been used for receiving and transmitting electromagnetic signals (e.g., radio waves). It is also possible to place embedded wire antennas of quarter or half wavelength in laminated rear windows of vehicles. Such wires are easily visible and are therefore prohibited for use in the front windshield or side windows of an automobile.

The use of thin-film antennas has been gaining popularity in recent years. Thin-film antennas are generally formed by applying a thin layer of conductive material to sheets of plastic film such as polyester, and then patterning the resulting sheets to form the conductive surfaces of antennas. Alternatively, conductive material may also be deposited on plastic or other dielectric sheets in desired patterns to form the antennas with the use of well-known masking and deposition techniques.

One area where there has been increased interest in using such thin-film antennas is for window-mounted applications in motor vehicles, aircraft, and the like. Due to the increasing need for different modes of wire-less communication, thin-film window antennas represent a desirable alternative to populating a vehicle or aircraft structure with mast antennas, or other types of non-conformal type antennas, which can detract from the aerodynamic and aesthetic appearance of the surface.

Thin film antennas designed to be affixed to any window of the vehicle (e.g., the windshield) are known in the art. An example of such an antenna is described in U.S. Pat. No. 5,083,135 to Nagy et al., entitled "Transparent film antenna for a vehicle window." Nagy et al. disclose using a transparent conductive film, such as indium-tin-oxide (ITO), for the antenna conductor. However, they acknowledge that there is a compromise between transparency, which requires a very thin layer of ITO, and sufficient film conductivity to give good antenna performance, which requires a thick layer of ITO. Nagy et al. attempt to solve this problem by placing the antenna very high up on the windshield to inductively couple it to the car body. This substantially restricts design freedom.

There is a conflict between the optical transparency and the conductivity (or surface resistance) of thin-films utilized to make such antennas. For example, copper films having a surface resistance of about 0.25 milliohms/square are commercially available, but their transparency is well below the desired level of 70%. Other commercially available thin-films formed from conductive materials such as ITO or silver have acceptable transparencies (for example, AgHT™ silver type films have optical transparencies greater than 75%), but such films have surface resistances in the range of 4-8 ohms/square, which is several orders of magnitude greater than that of the above copper films, or conventional conductors used for antenna construction. When transparent thin-films having a higher surface resistance are used as the conductive surfaces for an antenna, the performance of the antenna is substantially diminished. Antenna efficiency is reduced due to ohmic loss in the higher resistance films, and as a result, antenna gain can be reduced by as much as 3-6 dB, depending upon the type of antenna.

The transparency of window-mounted thin-film antennas is an important consideration, but other factors are important to meet the requirement of invisibility. U.S. Pat. No. 7,656,357 to Ishibashi et al., entitled "Transparent antenna for vehicle and vehicle glass with antenna," describes a transparent antenna to be installed on a glass surface of a vehicle. Ishibashi et al. achieve good antenna performance and light transmittance using a copper foil with a low-reflection treatment and photoetching to remove copper resulting in a sparse mesh pattern. To further reduce the visibility of the mesh, Ishibashi et al. require a gradation region of progressive wider openings and sparser lines in the mesh pattern at the outlines of each mesh. U.S. Pat. No. 9,231,213 to Song et al., entitled "Methods for integrating and forming optically transparent devices on surfaces," describes coplanar waveguide antennas where the edges of the mesh are critical to the radiation emitted and need to be the highest conductivity region in the mesh and should not be compromised to reduce visibility.

In the past, attempts have been made to improve the efficiency of transparent thin-film antennas by increasing the conductivity of the surface. This is typically accomplished by increasing the thickness or type of conductive material applied, or by placing relatively thick sheets of non-transparent highly conductive material on the antenna. In doing so, the antennas become non-transparent.

U.S. Pat. No. 8,941,095 to Song et al., entitled "Methods for integrating and forming optically transparent devices on surfaces," describes an ideal thin-film antenna as having regions of perfect electrical conductivity and regions of glass, which is an insulating dielectric. Song et al. propose using films of silver nanowire or graphene or other conductive materials such as ITO, that all give compromised performance. U.S. Pat. No. 9,504,164 to Ramakrishnan et al., entitled "Manufacturing of high resolution conductive patterns using organometallic ink and banded anilox rolls," describes a method of making a touch sensor which includes flexographically printing a pattern of thin lines on a region of a substrate, and then plating the pattern to create a pattern of microwires on the region of the substrate that exhibits high conductivity and high transparency. Areas that are not patterned and plated remain in an insulative state. The method described by Ramakrishnan et al. can be adapted to make a thin-film antenna, however the viewing conditions for a touch screen application is very different from that of a transparent antenna.

The touch screens of Ramakrishnan et al. are applied onto a digital display for applications that require touch input, such as cell phones and computers. In these applications, the touch screens have a very uniform pattern throughout the functional area; the touch screens are back lit (typically by LED displays); and the viewing conditions are normally in relatively low intensity indoor lighting environments.

In contrast, window mounted thin-film antennas are typically used in brightly lit viewing conditions (e.g., outdoor sunlight), the antenna pattern is typically much smaller than the entire glass surface to which it is affixed, the antenna can be viewed from both sides, with transmissive and reflective visibility requirements, and the conductivity requirement for the conductive regions is typically much higher than for a capacitive touch screen.

There remains a need for improved thin-film conducting antennas that can be incorporated into transparent surfaces without compromising antenna performance or unnecessarily obstructing the optical view through such surfaces and that are undetectable to a human observer.

SUMMARY OF THE INVENTION

The present invention represents a transparent antenna, including:
a non-opaque substrate;
a conductive material disposed on a surface of the substrate in one or more conductive regions, wherein a geometry of the conductive regions defines an antenna pattern;
a non-conductive material disposed on the surface of the substrate in a fill pattern including one or more non-conductive regions, wherein the fill pattern is an inverse of the antenna pattern within a defined region of interest; and
wherein an average optical transparency in the conductive regions is at least 50%, wherein an average optical transparency in the non-conductive regions is at least 50%, and wherein the average optical transparency in the conductive regions differs from the average optical transparency in the non-conductive regions by no more than 10%.

This invention has the advantage that an antenna can be provided on a transparent surface that is visually undetectable. The antenna is formed using a pattern of micro-wires having a low visibility. The visibility of the antenna pattern is further masked by surrounding it by a fill pattern of a non-conductive material which has matching optical characteristics.

BRIEF DESCRIPTION OF THE DRAWINGS

FIG. 3 is a plan view of a planar antenna geometry;
FIG. 4A-4C illustrate different patterns appropriate for use in conductive and non-conductive regions in embodiments of the present invention.

It is to be understood that the attached drawings are for purposes of illustrating the concepts of the invention and may not be to scale. Identical reference numerals have been used, where possible, to designate identical features that are common to the figures.

DETAILED DESCRIPTION OF THE INVENTION

Figure 1:
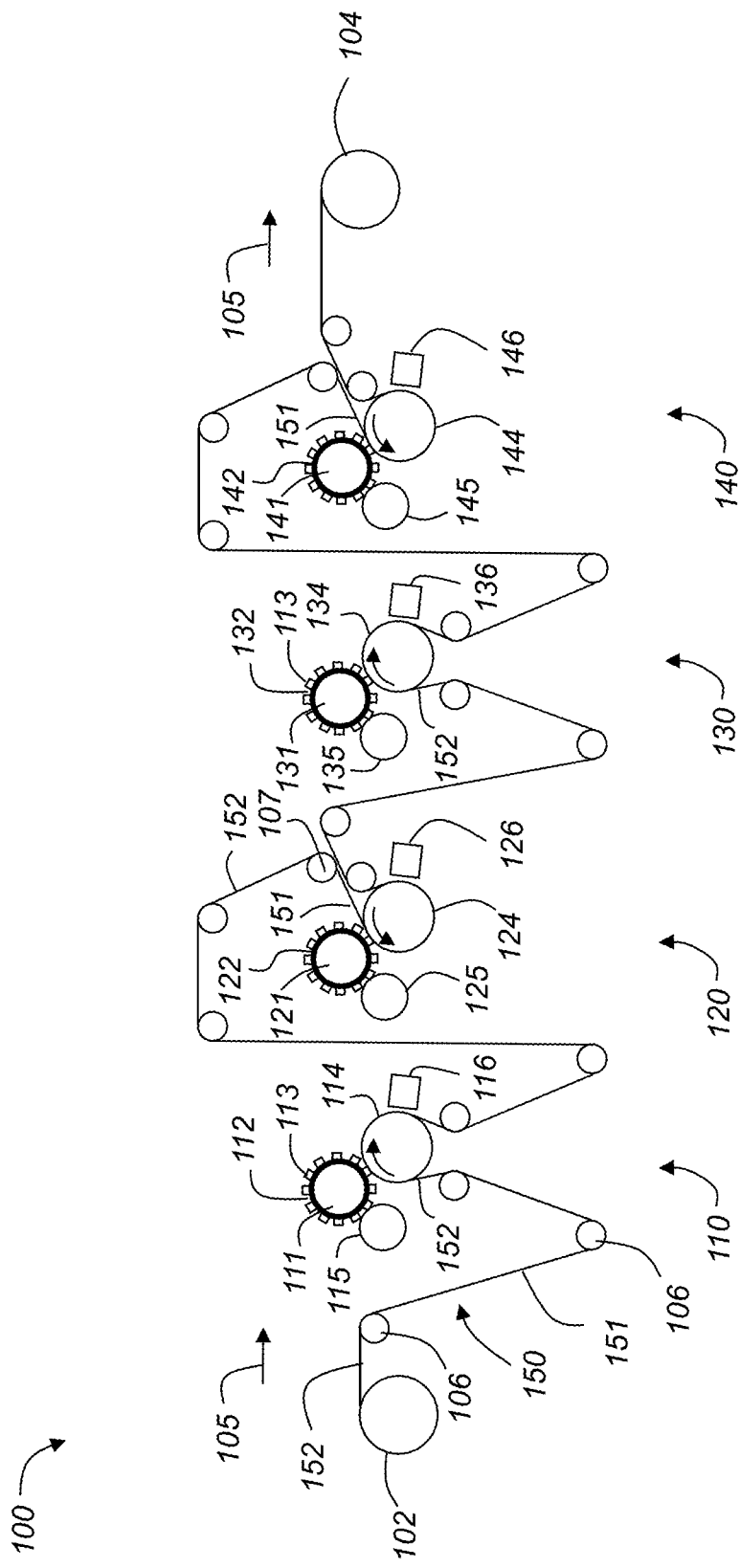
FIG. 1 is a schematic side view of a flexographic printing system for roll-to-roll printing on both sides of a substrate.

The present description will be directed in particular to elements forming part of, or cooperating more directly with, an apparatus in accordance with the present invention. It is to be understood that elements not specifically shown, labeled, or described can take various forms well known to those skilled in the art. In the following description and drawings, identical reference numerals have been used, where possible, to designate identical elements. It is to be understood that elements and components can be referred to in singular or plural form, as appropriate, without limiting the scope of the invention.

The invention is inclusive of combinations of the embodiments described herein. References to "a particular embodiment" and the like refer to features that are present in at least one embodiment of the invention. Separate references to "an embodiment" or "particular embodiments" or the like do not necessarily refer to the same embodiment or embodiments; however, such embodiments are not mutually exclusive, unless so indicated or as are readily apparent to one of skill in the art. It should be noted that, unless otherwise explicitly noted or required by context, the word "or" is used in this disclosure in a non-exclusive sense.

The example embodiments of the present invention are illustrated schematically and not to scale for the sake of clarity. One of ordinary skill in the art will be able to readily determine the specific size and interconnections of the elements of the example embodiments of the present invention.

References to upstream and downstream herein refer to direction of flow. Web media moves along a media path in a web advance direction from upstream to downstream. Similarly, fluids flow through a fluid line in a direction from upstream to downstream. In some instances, a fluid can flow in an opposite direction from the web advance direction. For clarification herein, upstream and downstream are meant to refer to the web motion unless otherwise noted.

FIG. 1 is a schematic side view of a flexographic printing system 100 that can be used in some embodiments of the invention for roll-to-roll printing of a catalytic ink on both sides of a substrate 150 for subsequent electroless plating. Substrate 150 is fed as a web from supply roll 102 to take-up roll 104 through flexographic printing system 100. Substrate 150 has a first side 151 and a second side 152.

The flexographic printing system 100 includes two print modules 120 and 140 that are configured to print on the first side 151 of substrate 150, as well as two print modules 110 and 130 that are configured to print on the second side 152 of substrate 150. The web of substrate 150 travels overall in roll-to-roll direction 105 (left to right in the example of FIG. 1). However, various rollers 106 and 107 are used to locally change the direction of the web of substrate as needed for adjusting web tension, providing a buffer, and reversing the substrate 150 for printing on an opposite side. In particular, note that in print module 120, roller 107 serves to reverse the local direction of the web of substrate 150 so that it is moving substantially in a right-to-left direction.

Each of the print modules 110, 120, 130, 140 includes some similar components including a respective plate cylinder 111, 121, 131, 141, on which is mounted a respective flexographic printing plate 112, 122, 132, 142, respectively. Each flexographic printing plate 112, 122, 132, 142 has raised features 113 defining an image pattern to be printed on the substrate 150. Each print module 110, 120, 130, 140 also includes a respective impression cylinder 114, 124, 134, 144 that is configured to force a side of the substrate 150 into contact with the corresponding flexographic printing plate 112, 122, 132, 142. Impression cylinders 124 and 144 of print modules 120 and 140 (for printing on first side 151 of substrate 150) rotate counter-clockwise in the view shown in FIG. 1, while impression cylinders 114 and 134 of print modules 110 and 130 (for printing on second side 152 of substrate 150) rotate clockwise in this view.

Each print module 110, 120, 130, 140 also includes a respective anilox roller 115, 125, 135, 145 for providing ink to the corresponding flexographic printing plate 112, 122, 132, 142. As is well known in the printing industry, an anilox roller is a hard cylinder, usually constructed of a steel or aluminum core, having an outer surface containing millions of very fine dimples, known as cells. Ink is provided to the anilox roller by a tray or chambered reservoir (not shown). In some embodiments, some or all of the print modules 110, 120, 130, 140 also include respective UV curing stations 116, 126, 136, 146 for curing the printed ink on substrate 150.

Figure 2:
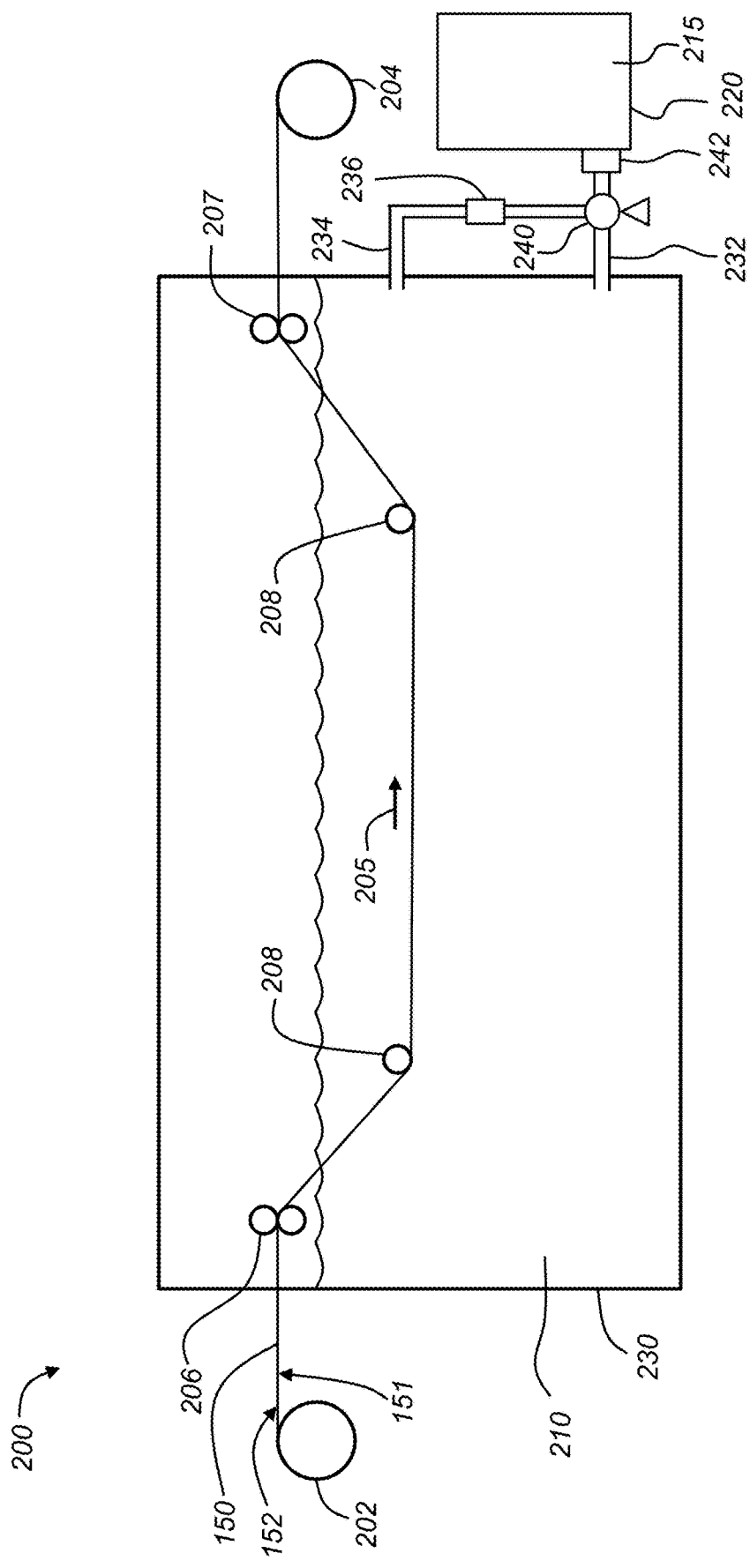
FIG. 2 is a schematic side view of a roll-to-roll electroless plating system.

FIG. 2 is a schematic side view of a roll-to-roll electroless plating system 200 disclosed in commonly-assigned, co-pending U.S. Patent Application Publication 2016/0168713 entitled "Roll-to-roll electroless plating system with liquid flow bearing," by S. Reuter et al., which is incorporated herein by reference. The roll-to-roll electroless plating system 200 includes a tank 230 of plating solution 210. A web of substrate 150 is fed by a web advance system along a web-transport path in an in-track direction 205 from a supply roll 202 to a take-up roll 204. The web of substrate 150 is a substrate upon which electroless plating is to be performed. Drive roller 206 is positioned upstream of the plating solution 210 and drive roller 207 is positioned downstream of the plating solution 210. Drive rollers 206 and 207 advance the web of substrate 150 from the supply roll 202 through the tank of plating solution 210 to the take-up roll 204. Web-guiding rollers 208 are at least partially submerged in the plating solution 210 in the tank 230 and guide the web of substrate 150 along the web-transport path in the in-track direction 205.

As the web of substrate 150 is advanced through the plating solution 210 in the tank 230, a metallic plating substance such as copper, silver, gold, nickel or palladium is electrolessly plated from the plating solution 210 onto predetermined locations on one or both of a first surface 151 and a second surface 152 of the web of substrate 150. As a result, the concentration of the metal or other components in the plating solution 210 in the tank 230 decreases and the plating solution 210 needs to be refreshed. To refresh the plating solution 210, it is recirculated by pump 240, and replenished plating solution 215 from a reservoir 220 is added under the control of controller 242, which can include a valve (not shown). In the example shown in FIG. 2, plating solution 210 is moved from tank 230 to pump 240 through a drain pipe 232 and is returned from pump 240 to tank 230 through a return pipe 234. In order to remove particulates from plating solution 210, a filter 236 can be included, typically downstream of the pump 240.

FIG. 3 shows an exemplary thin-film antenna 300 that includes a non-opaque substrate 150 (i.e., a substrate that is at least partially transparent) overlaid with a conductive planar antenna pattern 320. Preferably, the substrate has an optical transparency that is at least 50% in a relevant wavelength range (e.g., the visible wavelength range). Examples of appropriate substrates would include plastic substrates (such polyester, polycarbonate or acrylic) or glasses (such as Corning® Willow® Glass). The thin-film antenna 300 can be configured to receive or transmit signals in the frequency band relevant for a particular application (e.g., RF frequencies, microwave frequencies or millimeter-wave frequencies). Methods for designing antenna patterns 320 appropriate for different applications are well-known in the art.

The exemplary thin-film antenna 300 illustrated in FIG. 3 shows a compound multi-frequency RF antenna pattern that includes features similar to those found in a slot antenna such as is shown in U.S. Pat. No. 6,911,952 to E. Sievenpiper, entitled "Crossed-slot antenna for mobile satellite and terrestrial radio reception," and an aperture antenna such as is shown in U.S. Pat. No. 7,233,296 to H. Song et al., entitled "Transparent thin-film antenna." The antenna pattern 320 includes a center conductor signal strip (conductive region 365) and coplanar ground regions (conductive region 360), together with an inner non-conductive region 380 and outer non-conductive region 381. Preferably the conductive regions 360, 365 have a resistance of no more than 1 ohm/square.

In a preferred embodiment, the conductive regions 360, 365 of the thin-film antenna 300 are fabricated by using a printing press, such as the flexographic printing system 100 of FIG. 1, to print a pattern of catalytic ink, and then using a roll-to-roll electroless plating system 200 (FIG. 2) to plate a layer of metal over the catalytic ink. However, it will be clear to one skilled in the art that the pattern of conductive regions 360, 365 can be formed using a variety of methods known in the art. For example, a gravure printing press can be used instead of the flexographic printing system 100. In another embodiment, the thin-film antenna 300 can be formed using an imprint and fill technique such as that disclosed in commonly-assigned U.S. Pat. No. 8,865,292 to D. Trauernicht et al., entitled "Micro-channel structure for micro-wires," which is incorporated herein by reference.

In an exemplary configuration, the conductive regions 360, 365 consist of microwire meshes formed using the electroless plating method described previously relative to FIGS. 1-2 to deposit thin conductive microwires with sufficient density to achieve the required conductivity and with sufficient spacing between the microwires to achieve the required transparency. FIG. 4A shows an exemplary microwire mesh pattern 410 that can be used in the conductive regions 360, 365. This mesh pattern 410 includes a pattern of interconnected microwires 412 and is preferred for isotropic electrical conductivity. The halftone patterns 430, 431 shown in FIG. 4B are not generally useful for electrical conductivity, but can be used to aid in masking the thin-film antenna 300 to make it more difficult to see. Similarly, FIG. 4C illustrates a halftone pattern 440 incorporating a density gradient.

In some embodiments, a protective layer of transparent material can be disposed over the conductive regions 360, 365 and the non-conductive regions 380, 381 on the surface of the substrate 150 to protect the thin-film antenna 300 from being damaged. For example, a layer of protective material can be laminated over the surface of the substrate.

Typically, the thin-film antenna 300 is formed on a flexible transparent substrate 150. In some configurations, the substrate with the thin-film antenna 300 can then be laminated onto the surface of a window (e.g., and automobile window, a building window or a helmet visor). The window can be made of a variety of materials such as glass, polycarbonate or acrylic. Preferably, the surface having the thin-film antenna 300 can face the window to protect it from physical damage. In some cases, the substrate with the thin-film antenna 300 can be laminated between two pieces of glass. In some arrangements, a portion of the thin-film antenna 300 that includes contact points can extend beyond the edges of the glass so that the thin-film antenna 300 can be connected to appropriate electrical circuitry.

Window mounted thin-film antennas are difficult to make completely invisible (while maintaining sufficient wire density) because they are often viewed in brightly lit viewing conditions (e.g., outdoor sunlight), the antenna pattern is typically much smaller than the entire glass surface to which it is affixed, and the antenna can be viewed from both sides, with both transmissive and reflective invisibility requirements. Thus, several methods for masking the visibility of the thin-film antennas (i.e., making them more difficult to detect visually) will be described.

The ink that is used in the flexographic printing system 100 shown in FIG. 1 remains on the substrate 150 even after electroless plating. The ink contains metal particles, such as silver nanoparticles, that act as nucleation sites for the electroless plating process. Preferably, the ink can also contain pigment particles that cause the printed ink pattern to have a matte neutral color. The printed ink pattern will still be visible when viewing the antenna from the first side 151 of the substrate 150 so that it will appear to have a matte neutral color. In some configurations, after plating the ink with a metal such as copper, the substrate 150 with the microwires can be put through a second bath to apply a darkening agent. In an exemplary configuration, palladium is used as a darkening agent. This darkening agent covers the second side of the plated metal microwires as well as the edges of the microwires as they are also exposed to the bath with the darkening agent. Both the darkening agent and the ink with the pigment particles that cover the metal wires have the beneficial effect of creating a neutral color and reducing reflection and glint off the metallic surfaces of the microwires when they are viewed from the second side 152 of the substrate 150.

Figure 5C:
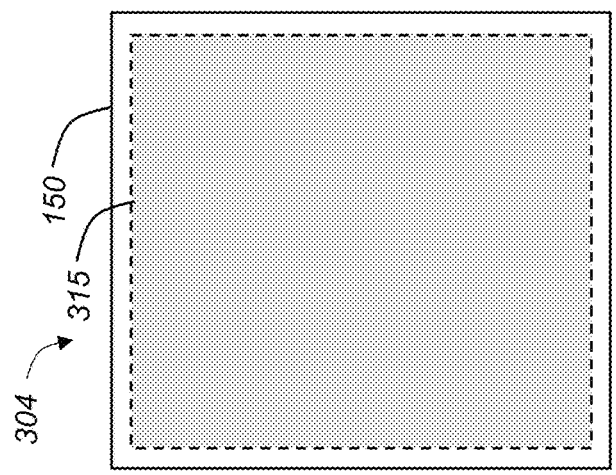
FIGS. 5A-5C illustrate the formation of a transparent antenna including a conductive antenna pattern and a complementary non-conductive fill pattern according to an exemplary embodiment.
Figure 5B:
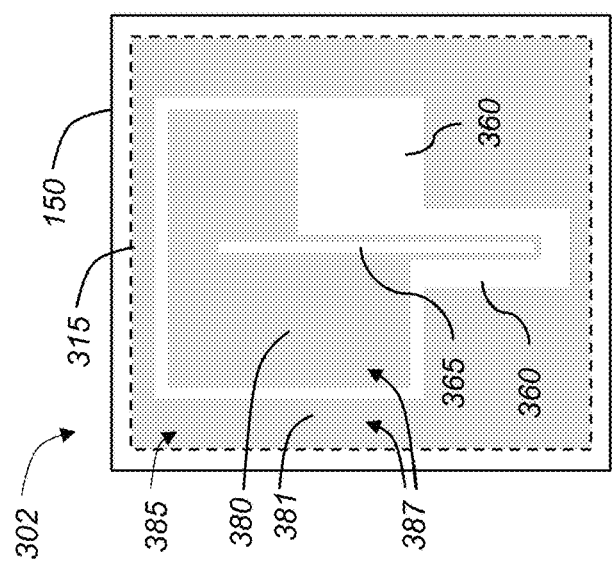
Figure 5A:
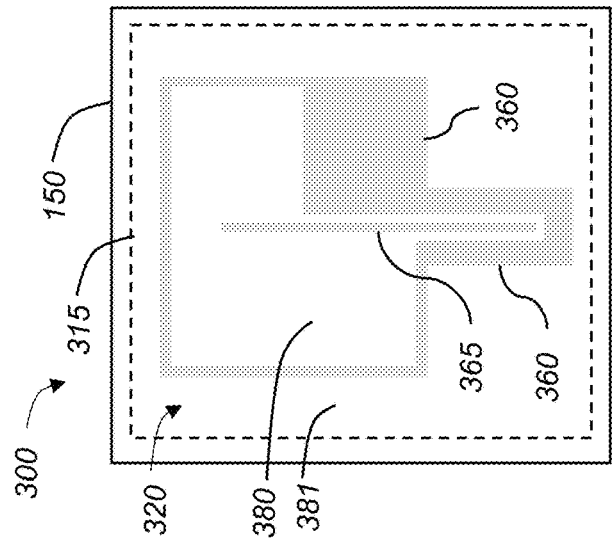

The flexographic printing system 100 (FIG. 1) has the capability to print a plurality of patterns on the substrate 150 in very good register. In an exemplary embodiment, one of the flexographic printing plates 112 is used to print the antenna pattern 320, and another of the flexographic printing plates 132 is used to print a complementary image 302 which includes an inverse pattern 385 as illustrated in FIGS. 5A-5C. The complementary image 302 is printed using a non-catalytic ink containing a pigment but no metallic nanoparticles. The non-catalytic ink is non-conductive and does not serve as a catalyst for the electroless plating process. In this way, the complementary image 302 is insulating so that it does not degrade the performance of the thin-film antenna. The required close alignment of the inverse pattern 385 with the antenna pattern 320 is enabled by the precision alignment capabilities of the flexographic printing system 100.

The inverse pattern 385 is an inverse of the antenna pattern 320 within a defined region of interest 315, and shares one or more common boundaries with the antenna pattern 320. Within the region of interest 315, a fill pattern 387 is printed in the areas of the complementary image 302 corresponding to the non-conductive regions 380, 381 of the antenna patter 320, and no fill pattern 387 is printed in the complementary image 302 in the areas corresponding to the conductive regions 360, 365 of the antenna pattern 320. The inverse pattern 385 can also be called a "complementary pattern" or a "fill pattern" in the sense that it is complementary to the antenna pattern 320 and fills the open areas within and around the antenna pattern 320. In an exemplary configuration, both the antenna pattern 320 and the inverse pattern 385 are printed on the same side of the substrate 150, however this is not a requirement.

In some configurations, the fill regions 387 of the inverse pattern 385 can be printed using a pattern of lines having a pattern geometry which matches the pattern of interconnected microwires in the conductive regions 360, 365 of the antenna pattern 320. For example, if the conductive regions 360, 365 are formed using the mesh pattern 410 of FIG. 4A, the fill regions 387 can be formed using a pattern of non-conductive lines arranged in the same mesh pattern 410. Within the context of the present disclosure the pattern geometry of the pattern of lines in the fill regions 387 is said to match the pattern of microwires in the conductive regions 360, 365 if they have the same line spacing and line angles. (They do not necessarily have the same line width.) In other configurations, the fill regions 387 can be printed using other types of patterns such as halftone patterns 430, 431 (FIG. 4C) or uniform density patterns (not shown).

The apparent density and color of the fill pattern 387 in the complementary image 302 is preferably chosen to closely match that of the metal-plated conductive regions 360, 365 (i.e., the radiative portions) in the thin-film antenna 300 so that when the images are overlaid with each other to form a composite antenna 304 the result is a visually uniform image appearance as shown in FIG. 5C so that the antenna is more difficult to detect and preferably visually undetectable. Within the context of the present disclosure, "visually undetectable" means that the structure of the thin-film antenna 300 is not readily detectable with the unaided eye for a typical human observer viewing the composite antenna 304 at a specified viewing distance. Said another way, the thin-film antenna 300 is substantially visually indistinguishable from the complementary image 302. The relevant viewing distance may be application dependent. For example, for cases where the thin-film antenna 300 is integrated into an automobile windshield, the relevant viewing distance would be the distance from the normal position of the driver's head to the position of the thin-film antenna 300 on the windshield.

The density (or equivalently the average optical transparency) of the fill pattern 387 can be controlled by adjusting the linewidth or line spacing in the mesh pattern 410 or the halftone dot size of the halftone pattern 430, 431. The color of the fill pattern 387 can be controlled by the composition of the non-catalytic ink that is used to print the complementary image. Generally, it is desirable if the average optical transparency of the fill pattern 387 in the non-conductive regions 380, 381 differs from the average optical transparence of the conductive regions 360, 365 of the thin-film antenna 300 by no more than 10%. More preferably the average optical transparencies differ by 3% or less. Preferably, the average optical reflectance of the fill pattern 387 and the conductive regions 360, 365 are also controlled such that they differ by no more than 10%, and more preferably by nor more than 50%.

The color difference between the fill pattern 387 in the non-conductive regions 380, 381 and the conductive regions 360, 365 of the thin-film antenna 300 can be characterized using any metric known in the color measurement art, such as the well-known CIE $\Delta E^*$ metric. Preferably the color difference should be no more than 10 $\Delta E^*$, and more preferably is 3 $\Delta E^*$ or less.

In a preferred configuration, the resulting composite antenna 304 is substantially transparent so that it can be applied on a window (e.g., an automobile window) without significantly affecting the ability of an observer to look through the window. In many applications, it is desirable that the average optical transparency of both the fill pattern 387 in the non-conductive regions 380, 381 and the conductive regions 360, 365 of the thin-film antenna 300 be at least 50%, and more preferably at least 80%.

Figure 6C:
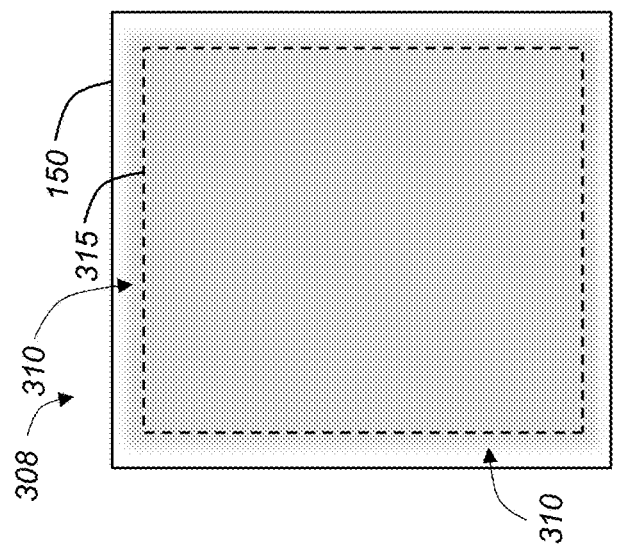
FIG. 6A-6C illustrate an alternate embodiment of a transparent antenna including a blurred outer edge in a transition region.
Figure 6B:
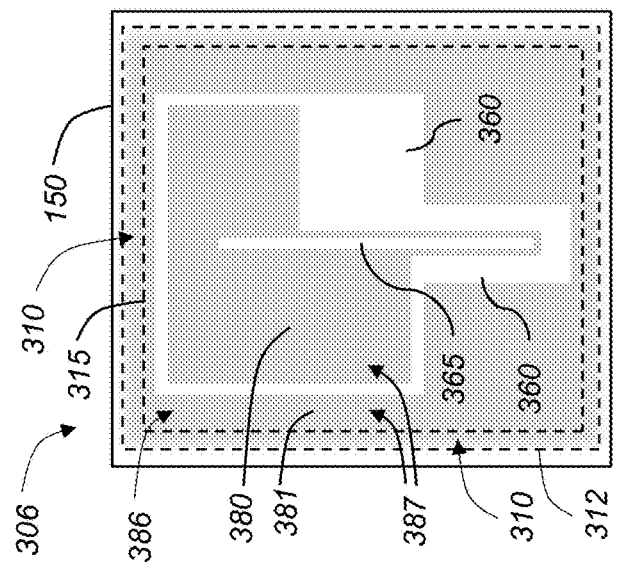
Figure 6A:
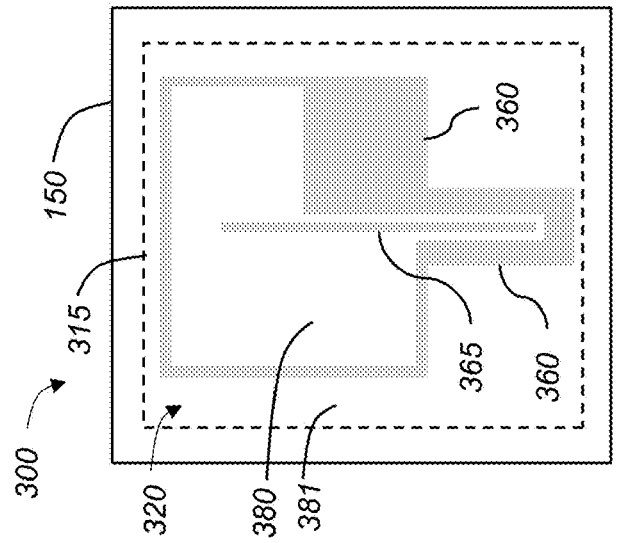

Depending on the average optical transparency of the fill pattern 387 in the non-conductive regions 380, 381 and the conductive regions 360, 365 of the thin-film antenna 300, the edges of the composite antenna 304 may be visually detectable even if the thin-film antenna 300 is visually indistinguishable from the fill pattern 387. FIGS. 6A-6C illustrate an alternate confirmation where a composite antenna 308 is formed having a transition region 310 to reduce the visibility of the edges of the composite antenna 308. The composite antenna 308 is formed by combining the same antenna pattern 320 that was shown in FIG. 5A with a complementary image 306 including a complementary pattern 386 with a blurred outer edge in a transition region 310. The transition region 310 has an outer boundary 312 and an inner boundary corresponding to the other boundary of the region of interest 315. The transition region 310 provides a smooth transition between the average optical transparency of the fill pattern 387 and the higher optical transparency of the substrate 150. As is well-known to those skilled in the art, the human visual system is more sensitive to detecting sharp edges than it is to detecting gradual gradients. As a result, the use of a transition region 310 can substantially mask, or even eliminate, the visibility of the edges of the composite antenna 307. In some configurations, the transition region 310 can be formed using a gradient halftone pattern 440 such as that illustrated in FIG. 4D.

In some applications, the composite antenna 304 (FIG. 5C) can be placed in a portion of a window where a high level of optical transparency is not critical, such as in the top or bottom portion of an automobile windshield. These portions of the windshield are often tinted so that they have a transparency of less than 50%. In such cases, the optical transparency and color of the composite antenna 304 can be controlled to substantially match the transparency of the tinted region (e.g., to within 10%), or can actually serve to provide the tinting. In this case, even though the overall density of the composite antenna 304 may be visible to an observer, the antenna pattern 320 will be visually indistinguishable from the fill pattern 387 and the window tint so that the antenna pattern 320 will be visually undetectable.

Figure 7:
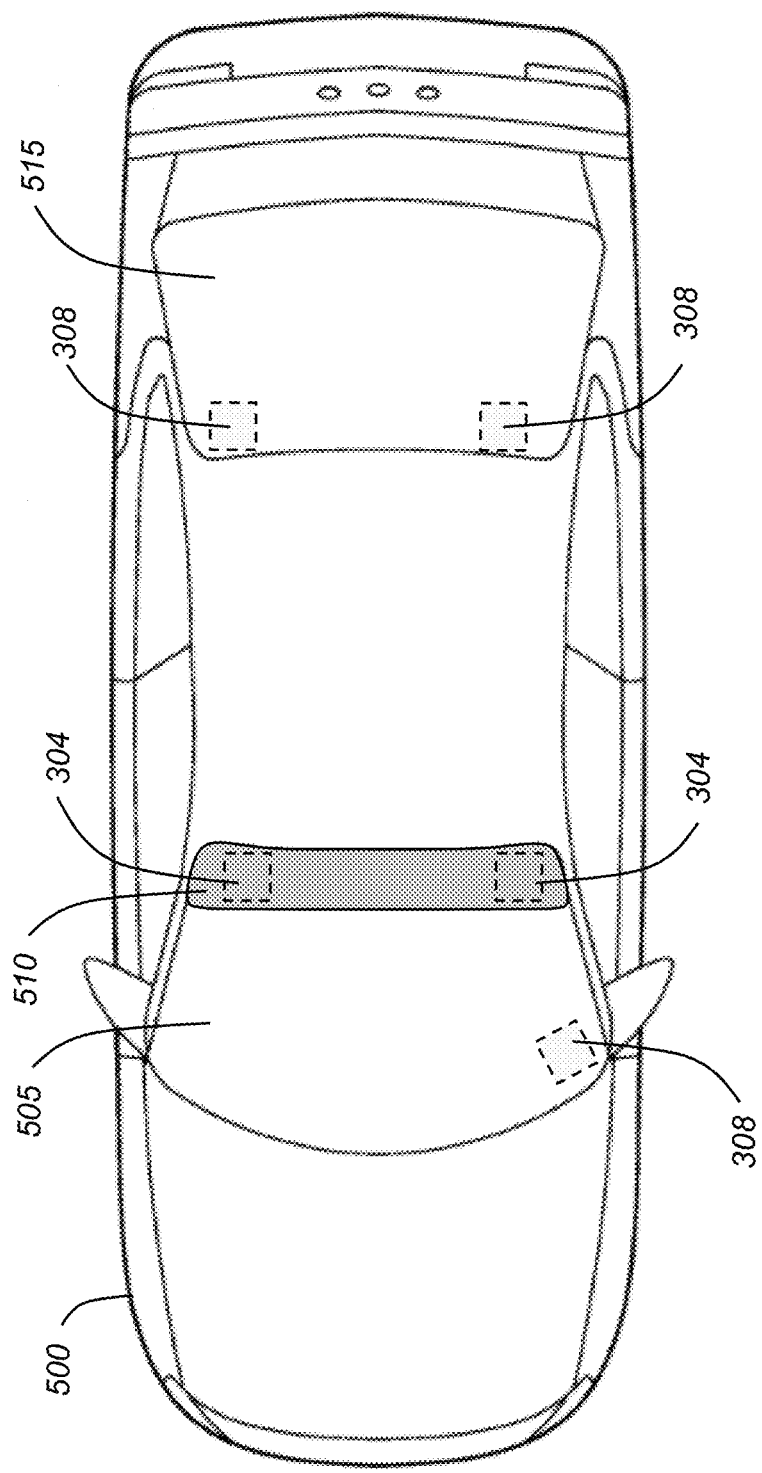
FIG. 7 illustrates transparent antennas incorporated into windows of an automobile.

FIG. 7 shows an automobile 500 where a shade band, shown as a tinted region 510, is provided at the top of the windshield 505. Two composite antennas 304, such as those described with respect to FIG. 5C, are provided in the tinted region 510. The average optical transparency and color of the composite antenna 304 (i.e., the average optical transparency and color of the metal-plated conductive regions 360, 365 in the thin-film antenna 300 and the fill pattern 387 in the complementary image 302 (see FIGS. 5A-5B)) are controlled to closely match each other and to match that of the tinted region 510 such that the composite antenna 304 is visually indistinguishable to an un-aided observer at a normal viewing distance. In some embodiments, the region of interest 315 for the composite antenna 304 can correspond to the entire area of the tinted region 510 such that the composite antenna 304 can be used to provide the tinting for the tinted region 510 without the need for additional tinting features. In this case, the average optical transparency and color of the composite antenna 304 can be selected to provide the desire density and color of the tinted region 510.

In some applications, it is useful to provide a variety of antennas in the windows of the automobile 500 to serve various purposes (e.g., AM radio, FM radio, GPS, cell phone, WiFi, etc.). In the illustrated configuration, in addition to the composite antennas 304 provided in the tinted region 510 of the windshield 505, an additional composite antenna 308 is provided in a lower corner of the windshield 505, and two additional composite antennas 308 are provided in the rear window 515. In this case, the additional composite antennas 308 include transition regions 310 as shown in FIG. 6C to reduce the visibility of the edges of the antenna regions.

Figure 9:
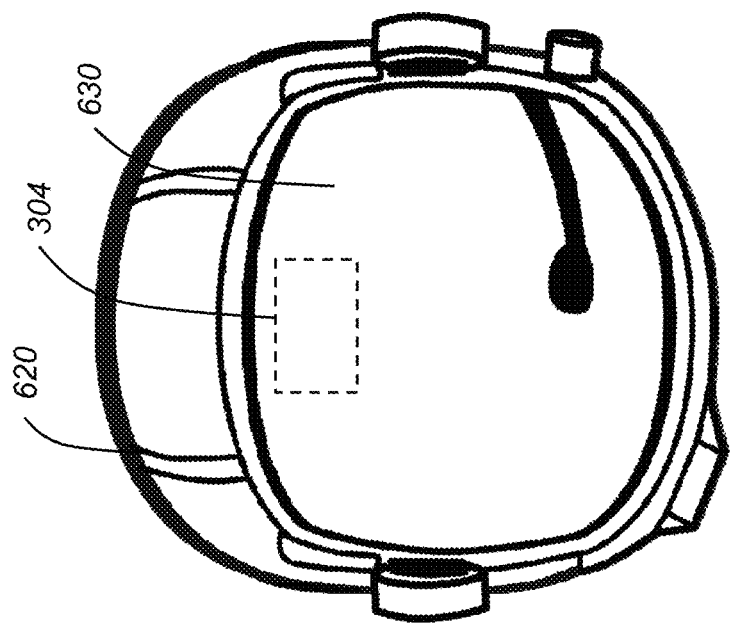
FIG. 9 illustrates a transparent antenna incorporated into a helmet visor.
Figure 8:
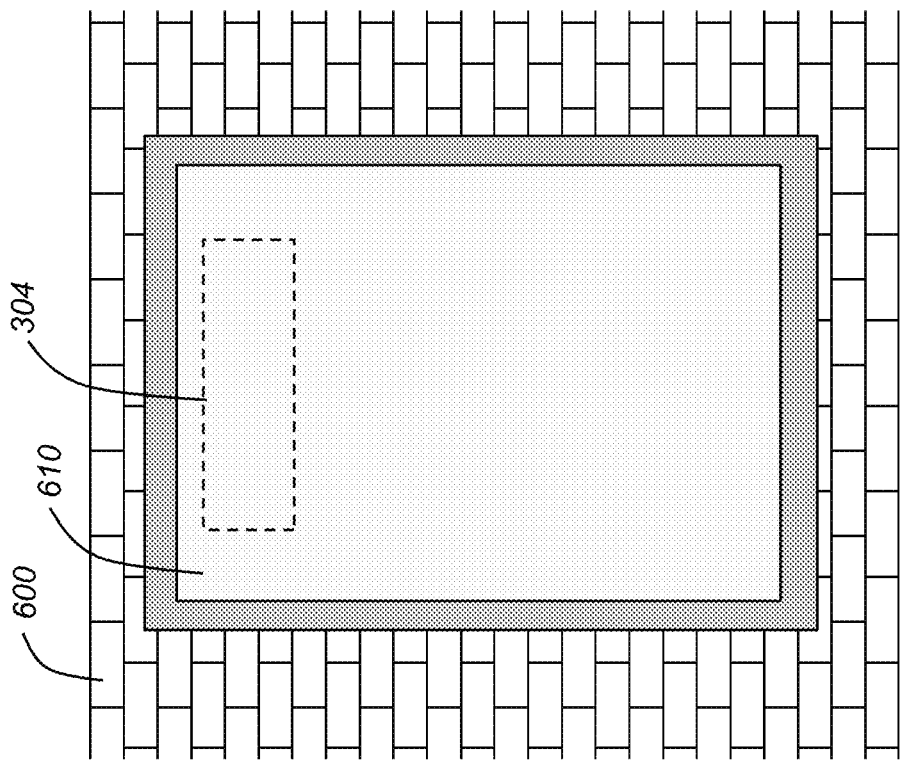
FIG. 8 illustrates a transparent antenna incorporated into a building window.

It will be obvious to one skilled in the art that the transparent composite antennas 304 of the present invention can be used for a wide variety of other applications. For example, they can be incorporated into other types of windows such as building windows and helmet visors (e.g., motorcycle helmets or military helmets), or into any other type of transparent or semi-transparent surface (e.g., tinted windows or visors). They can also be overlaid onto an opaque surface (e.g., a wall) such that they are substantially undetectable to an observer. FIG. 8 shows an example of a composite antenna 304 incorporated into a window 610 of a building 600, and FIG. 9 shows an example of a composite antenna 304 incorporated into a visor 630 of a helmet 620. In both of these cases, the window 610 or the visor 630 may include a tint, in which case the transparency and color of the composite antenna 304 is preferably controlled to match the tint or to produce the desired tint.

The invention has been described in detail with particular reference to certain preferred embodiments thereof, but it will be understood that variations and modifications can be effected within the spirit and scope of the invention.

PARTS LIST 100 flexographic printing system
102 supply roll
104 take-up roll
105 roll-to-roll direction
106 roller
107 roller
110 print module
111 plate cylinder
112 flexographic printing plate
113 raised features
114 impression cylinder
115 anilox roller
116 UV curing station
120 print module
121 plate cylinder
122 flexographic printing plate
124 impression cylinder
125 anilox roller
126 UV curing station
130 print module
131 plate cylinder
132 flexographic printing plate
134 impression cylinder
135 anilox roller
136 UV curing station
140 print module
141 plate cylinder
142 flexographic printing plate
144 impression cylinder
145 anilox roller
146 UV curing station
150 substrate
151 first side
152 second side
200 roll-to-roll electroless plating system
202 supply roll 204 take-up roll
205 in-track direction
206 drive roller
207 drive roller
208 web-guiding roller
210 plating solution
215 replenished plating solution
220 reservoir
230 tank
232 drain pipe
234 return pipe
236 filter
240 pump
242 controller
300 thin-film antenna
302 complementary image
304 composite antenna
306 complementary image
308 composite antenna
310 transition region
312 outer boundary
315 region of interest
320 antenna pattern
360 conductive region
365 conductive region
380 non-conductive region
381 non-conductive region
385 inverse pattern
386 complementary pattern
387 fill pattern
410 mesh pattern
412 microwire
430 halftone pattern
431 halftone pattern
440 halftone pattern
500 automobile
505 windshield
510 tinted region
515 rear window
600 building
610 window
620 helmet
630 visor

The invention claimed is:

1. A transparent antenna, comprising:
a non-opaque substrate;
a conductive material disposed on a surface of the substrate in one or more conductive regions, wherein a geometry of the conductive regions defines an antenna pattern;
a non-conductive material disposed on the surface of the substrate in a fill pattern including one or more non-conductive regions, wherein the non-conductive material is a non-conductive ink, and wherein the fill pattern is an inverse of the antenna pattern within a defined region of interest; and
wherein an average optical transparency in the conductive regions is at least 50%, wherein an average optical transparency in the non-conductive regions is at least 50%, and wherein the average optical transparency in the conductive regions differs from the average optical transparency in the non-conductive regions by no more than 10%.

2. The transparent antenna of claim 1, wherein the non-conductive region shares one or more boundaries with the conductive region.

3. The transparent antenna of claim 1, wherein the conductive material in the conductive region includes a pattern of interconnected microwires.

4. The transparent antenna of claim 3, wherein the pattern of interconnected microwires is a mesh pattern.

5. The transparent antenna of claim 3, wherein the non-conductive material in the non-conductive region includes a pattern of lines having a pattern geometry which matches that of the pattern of interconnected microwires in the conductive region.

6. The transparent antenna of claim 1, wherein the non-conductive material in the non-conductive region includes a pattern of lines.

7. The transparent antenna of claim 6, wherein the pattern of lines is a mesh pattern.

8. The transparent antenna of claim 1, wherein the non-conductive material in the non-conductive region includes a pattern of halftone dots.

9. The transparent antenna of claim 1, wherein the conductive material is a metal.

10. The transparent antenna of claim 1, further including a protective layer of transparent material disposed over the conductive material and the non-conductive material on the surface of the substrate.

11. The transparent antenna of claim 1, wherein the substrate is polyester, glass, polycarbonate or acrylic.

12. The transparent antenna of claim 1, wherein the antenna pattern is visually indistinguishable from the fill pattern to a human observer.

13. The transparent antenna of claim 1, wherein the transparent antenna is laminated onto a rigid window.

14. The transparent antenna of claim 13, wherein the window is an automobile window, a building window or a helmet visor.

15. The transparent antenna of claim 13, wherein the transparent antenna is positioned within a tinted portion of the window.

16. The transparent antenna of claim 15, wherein the average optical transparency in the conductive region and the average optical transparency in the non-conductive region match an average optical transparency of the tinted portion of the window to within 10%.

17. The transparent antenna of claim 1, wherein the transparent antenna is configured to operate at one of RF, microwave and millimeter-wave frequencies.

18. The transparent antenna of claim 1, wherein the conductive region has a resistance of no more than 1 ohm/square.

19. The transparent antenna of claim 1, wherein the average optical transparency in the conductive region is at least 80%, and wherein the average optical transparency in the non-conductive region is at least 80%.

20. The transparent antenna of claim 1, wherein the average optical transparency in the conductive region differs from the average optical transparency in the non-conductive region by no more than 3%.

21. The transparent antenna of claim 1, further including a transition region adjacent to the region of interest, wherein the transition region has an outer boundary and an inner boundary, the inner boundary corresponding to an outer boundary of the region of interest, wherein the non-conductive material is disposed on the surface of the substrate in the transition region, and wherein an average optical transparency in the transition region transitions from a first average optical transparency at the inner boundary to a higher second average optical transparency at the outer boundary.

* * * * *